US009717149B2

(12) United States Patent
Dohn et al.

(10) Patent No.: US 9,717,149 B2
(45) Date of Patent: Jul. 25, 2017

(54) CIRCUIT BOARD MADE OF AlN WITH COPPER STRUCTURES

(71) Applicants: Alexander Dohn, Memmelsdorf (DE); Roland Leneis, Marktredwitz (DE); Klaus Herrmann, Thiersheim (DE); Dietmar Jähnig, Bindlach (DE)

(72) Inventors: Alexander Dohn, Memmelsdorf (DE); Roland Leneis, Marktredwitz (DE); Klaus Herrmann, Thiersheim (DE); Dietmar Jähnig, Bindlach (DE)

(73) Assignee: CeramTec GmbH, Plochingen (DE)

( * ) Notice: Subject to any disclaimer, the term of this patent is extended or adjusted under 35 U.S.C. 154(b) by 538 days.

(21) Appl. No.: 14/354,740

(22) PCT Filed: Oct. 31, 2012

(86) PCT No.: PCT/EP2012/071547

§ 371 (c)(1),
(2) Date: Apr. 28, 2014

(87) PCT Pub. No.: WO2013/064531

PCT Pub. Date: May 10, 2013

(65) Prior Publication Data

US 2014/0284087 A1 Sep. 25, 2014

(30) Foreign Application Priority Data

Nov. 3, 2011 (DE) ........................ 10 2011 117 538
Jun. 22, 2012 (DE) ........................ 10 2012 210 555
Jun. 27, 2012 (DE) ........................ 10 2012 012 692

(51) Int. Cl.

| | |
|---|---|
| ***H01K 3/10*** | (2006.01) |
| ***H05K 3/12*** | (2006.01) |
| ***H05K 3/24*** | (2006.01) |
| ***H05K 3/40*** | (2006.01) |
| ***H05K 1/11*** | (2006.01) |
| *H05K 1/02* | (2006.01) |
| *H05K 1/03* | (2006.01) |
| *H05K 1/09* | (2006.01) |

(52) U.S. Cl.

CPC ........... *H05K 3/1216* (2013.01); *H05K 1/115* (2013.01); *H05K 3/245* (2013.01); *H05K 3/4038* (2013.01); *H05K 3/4061* (2013.01); *H05K 1/0263* (2013.01); *H05K 1/0306* (2013.01); *H05K 1/092* (2013.01); *H05K 3/1291* (2013.01); *H05K 3/246* (2013.01); *H05K 2201/10106* (2013.01); *H05K 2203/086* (2013.01); *H05K 2203/1476* (2013.01); *Y10T 29/49165* (2015.01)

(58) Field of Classification Search

CPC .... H05K 3/1216; H05K 3/245; H05K 3/4061; H05K 3/4038; H05K 3/1291; H05K 3/246; H05K 1/115; H05K 1/0263; H05K 1/0306; H05K 1/092; H05K 2201/10106; H05K 2203/086; H05K 2203/1476; Y10T 29/49165; Y10T 29/49002

USPC .............. 29/852, 846, 829, 825, 592.1, 832; 174/255

See application file for complete search history.

(56) References Cited

U.S. PATENT DOCUMENTS

| | | | | |
|---|---|---|---|---|
| 5,856,028 A * | 1/1999 | Thimm | ................ | C04B 41/009 257/E23.075 |
| 7,388,296 B2 | 6/2008 | Urashima et al. | | |
| 7,825,422 B2 | 11/2010 | Maeda et al. | | |
| 2003/0108729 A1 | 6/2003 | Yamamoto et al. | | |
| 2005/0205293 A1 | 9/2005 | Yamada et al. | | |

FOREIGN PATENT DOCUMENTS

| | | |
|---|---|---|
| JP | 08-181441 A | 7/1996 |

* cited by examiner

*Primary Examiner* — Peter DungBa Vo
*Assistant Examiner* — Azm Parvez
(74) *Attorney, Agent, or Firm* — Norton Rose Fulbright US LLP

(57) ABSTRACT

Process for producing a ceramic circuit board with electrical conductor traces and contacting points on a side and with a through-hole contact by successively a) producing an AlN substrate and drilling holes at the locations for the vias, b) filling the holes with an adhesive paste containing copper, tungsten and/or molybdenum or alloys thereof, and c) single-pass overprinting with a second adhesive paste using a first screen-printing operation on a side of the ceramic substrate with the layout of the conductor traces and contact points, d) optionally, fully or partially repeating overprinting with the second adhesive paste, e) stoving the printed ceramic substrate in an oven with $N_2$ while controlling oxygen at 0-50 ppm $O_2$, f) overprinting using a second screen-printing process with a low-glass cover paste over the second adhesive paste, and g) stoving the printed ceramic substrate with $N_2$ while keeping the oxygen content at 0-50 ppm $O_2$.

18 Claims, No Drawings

CIRCUIT BOARD MADE OF AlN WITH COPPER STRUCTURES

This application is a §371 of International Application No. PCT/EP2012/071547 filed Oct. 31, 2012, and claims priority from German Patent Application Nos. 10 2011 117 538.9 filed Nov. 3, 2011, 10 2012 210 555.7 filed Jun. 22, 2012 and 10 2012 012 692.1 filed Jun. 27, 2012.

FIELD OF THE INVENTION

The invention relates to a method for producing a ceramic circuit board having printed electric conductors and contact points on at least one of the two sides and having at least one through-hole contact (via).

BACKGROUND AND OBJECTS OF THE INVENTION

The invention is based on the object of improving upon a method for producing a ceramic circuit board having electric printed conductors and contact points on at least one of the two sides and having at least one through-hole contact (via) so that the circuit boards produced by this method can be used in the LED technology for high-power light sources, which generate a great deal of heat and have a high current flow. Such high-power light sources are used as floodlights in a stadium, for example.

SUMMARY OF THE INVENTION

According to the invention, this object is achieved by the following process steps:

a) Producing a ceramic substrate of aluminum nitride and creating the boreholes at the locations provided for the vias,
b) Filling the boreholes with a first adhesive paste of copper, tungsten, molybdenum or their alloys or mixtures thereof, and
c) Overprinting once using a first screen printing process on at least one side of the ceramic substrate with the desired layout of the printed conductors and contact points using a second adhesive paste,
d) Optionally completely or partially repeating the overprinting using the second adhesive paste,
e) Firing the printed ceramic substrate in a fired oven with $N_2$ (nitrogen), wherein the oxygen content is kept at 0-50 ppm $O_2$ in a controlled manner,
f) Printing using a glass-lean cover paste on the second adhesive paste in a second screen printing operation until achieving the desired thickness of the printed conductors and contact points,
g) Firing the printed ceramic substrate in a firing oven with $N_2$ (nitrogen), wherein the oxygen content is kept at 0-50 ppm $O_2$ in a controlled manner.

Particularly thick or high printed conductors can be produced with this method.

DETAILED DESCRIPTION

Each screen printing process is preferably followed by a downstream drying process or firing process of the ceramic substrate, which improves adhesion and long-term stability.

In one embodiment of the invention, the printed conductors and contact points and/or the fired cover paste is/are reinforced with currentless [deposition of] nickel and gold in a corrosion-proof and solderable process.

Creation of the boreholes at the locations provided for the vias preferably takes place either before sintering by punching or after sintering by means of laser radiation.

In a preferred embodiment, a highly viscous copper paste is used as the first adhesive paste, its viscosity preferably being between 800 Pa·s and 1200 Pa·s preferably between 900 Pa·s and 1100 Pa·s and especially preferably 1000 Pa·s.

The copper paste preferably contains CuO or $Cu_2O$ and an adhesive glass preferably from ZnO—$SiO_2$ that is suitable for AlN.

In one embodiment, volume-enlarging components such as Al or Ti are preferably used in the copper paste along with substances such as CuCl that release copper.

The second adhesive paste is preferably identical to the first adhesive paste except for its viscosity, where the viscosity of the second adhesive paste is less than half of that of the first adhesive paste. "Approximately half" preferably means 50%±10%, especially preferably 50%±5% and most especially preferably 50%±2%.

The viscosity of the second adhesive paste is preferably 500 Pa·s. The phrase "500 Pa·s" is preferably understood to refer to a viscosity between 500±50 Pa·s, especially preferably 500±10 Pa·s.

In one embodiment of the invention the cover paste is identical to the adhesive paste except for the absence of the adhesive glass, but it has a lower viscosity than the adhesive paste, wherein the viscosity of the cover paste is between ⅓ and ⅔ of the viscosity of the adhesive paste and especially preferably is 40% to 60% of the viscosity of the adhesive paste.

In repeating the overprinting of the printed conductors and contact points, the overprinting is preferably 0.01-0.05 mm smaller.

In the case of a ceramic circuit board with printed conductors and contact points produced by the method described here, the vertical thickness or height of the printed conductors and contact points is preferably between 20 and 125 μm, preferably 60 to 90 μm.

According to the invention, the vias are preferably filled with copper, tungsten or molybdenum or mixtures thereof. Silver is not acceptable because its alloying reactions are too intense.

These circuit boards are preferably used for high-performance light sources in LED technology, where a great deal of heat is generated and high currents flow. Such high-power light sources are used as a floodlight system in stadiums for example.

Production Process:

1) A ceramic substrate of aluminum nitride is used for production; it is either punched before sintering or laser-drilled with a laser beam after sintering to create the vias in the locations.
2) According to the invention as the first step the vias are filled with an adhesive paste of copper, tungsten, molybdenum or their alloys or mixtures. A copper paste with a viscosity of 1000 Pa·s is preferably used as the adhesive paste. The copper via paste may contain CuO or $Cu_2O$ and an adhesive glass that is suitable for AlN, preferably of ZnO—$SiO_2$. In addition, volume-increasing components such as Al or Ti and substances that release copper in the heat such as CuCl are favorable.
3) Next, at least one side of the ceramic substrate is overprinted completely once by a screen printing process according to the desired layout of the printed conductors and contact points using the copper paste specified in point 2.

4) If especially thick printed conductors and contact points are to be produced, another screen printing process is additionally performed using the aforementioned copper paste as an adhesive paste. The copper paste may be overprinted completely or partially several times with a screen printing process.
5) Then the ceramic substrate with the printed adhesive paste(s) is dried preferably at 80° C.
6) Next, the printed ceramic substrate is run through a fired oven with $N_2$ (nitrogen) at 900° C. while the oxygen content is kept at a controlled 0-50 ppm $O_2$.
7) Next, a cover paste with a low glass content and a suitable viscosity and a suitable composition is overprinted over the fired adhesive paste until achieving the copper thickness of printed conductors and contact points, as mentioned above. The cover paste is identical to the adhesive paste except for the absence of the adhesive glass but it has a lower viscosity than the adhesive paste. The viscosity of the cover paste is preferably between ⅓ and ⅔ of the viscosity of the adhesive paste and especially preferably 40% to 60% of the viscosity of the adhesive paste.
8) Next, the ceramic substrate is dried with the printed cover paste, preferably at 80° C.
9) Next, the printed ceramic substrate is run through a fired oven with $N_2$ (nitrogen) at 900° C. while the oxygen content is kept at a controlled 0-50 ppm $O_2$.
10) Alternatively, point 6 is omitted and the cover paste is printed on the adhesive paste immediately after drying without a prior firing process.

According to the invention, the printed conductors and the contact points are preferably applied from copper or a copper alloy with at least one screen printing process using a proper paste on the ceramic substrate of aluminum nitride, wherein the aforementioned copper thickness is achieved. A single application is sufficient at a thickness or height of the printed conductors and contact points between 20 μm and 40 μm. If thicker or higher printed conductors and contact points of 40 μm to 125 μm are necessary, then preferably two or even more screen printing operations are performed. It is customary to work with two different pastes, namely an adhesive paste directly on the ceramic substrate and a cover paste on the adhesive paste. According to the invention, both pastes are applied exclusively with a screen printing process.

In the production process, the vias in the ceramic substrate are filled with an adhesive paste and at least one side of the ceramic substrate is completely overprinted with the adhesive paste once or twice according to the desired layout. The adhesive paste may additionally be printed with an additional screen printing process. It is preferably dried after each application. Next, a cover paste of a suitable viscosity and suitable composition is printed over the adhesive paste until the aforementioned copper thickness of the printed conductors and contact points has been achieved.

The other side of the circuit board, i.e., the bottom side, may also contain one or more overprints with copper paste.

The vias preferably have a diameter of 0.20 mm but the diameter may be adjusted depending on the thickness of the ceramic substrate. Thicker ceramic substrates need additional vias, i.e., vias with a larger diameter. If the ceramic substrate has a thickness of 1 mm, en the diameter of the vias must be 0.3-0.4 mm. The vias are preferably filled with a highly viscous copper paste with a viscosity of 1000 Pa·s on a screen printing machine with a suitable screen layout and a printing plate in the layout of the vias. The copper paste (in particular the adhesive paste directly on the AlN substrate) contains CuO or $Cu_2O$ and an adhesive glass that is suitable for AlN (such as preferably) made of ZnO—$SiO_2$. This is the first screen printing process. Then the printed substrate is preferably dried at 80° C.

Next another screen printing process with the same layout is performed on the screen printing machine using the same copper paste but preferably diluted to 500 Pa·s. This is the second screen printing process. The second screen printing process takes place precisely on the printed conductors and contact points produced by the first screen printing process so that their thickness or height increases.

The substrate prepared in this way is run through a firing oven with $N_2$ (nitrogen) at 900° C., while the oxygen content is kept at a controlled 0-50 ppm $O_2$. The copper never comes in contact with the firing additive. Then certain regions or structures or the entire structure that has already been printed and fired is reinforced on one or both sides with the help of an additional copper paste with a low glass content and then is fired again under the same conditions. The thickness of the copper layer is now the same as the thickness according to the invention.

The cover layer and/or the fired copper layer is/are then preferably reinforced in a corrosion-resistant and solderable manner with 4 μm currentless nickel, optionally 0.05 μm Pd and 0.05 μm currentless gold. The metallization, i.e., the copper layer forms such a tight seal with the ceramic that even the vias do not have any leaks through which the adhesive could penetrate to the top side of the LED, for example.

The ceramic substrate printed with the screen printing is fired either after each individual printing process or after all the printing processes together at a suitable temperature, usually for 6 to 10 minutes at 90° C., and in a nitrogen atmosphere with a very low residual oxygen content of preferably 0-50 ppm.

For AlN, the present invention closes the gap between the known DCB technology (above 200 μm) and thin film technology (up to approx. 20 μm) and permits the use of filled vias of the thin film technology, so that contacts on both sides are possible.

Now a concrete example:

A sintered ceramic substrate of AlN of the size 114×114×0.38 mm is laser drilled with a defined layout. The vias have a diameter of 0.20 mm. The vias are filled with a highly viscous copper paste of 1000 Pa·s on a screen printing machine with a suitable screen layout and a printing plate in the layout of the vias. The copper paste contains CuO and/or $Cu_2O$, an adhesive glass of ZnO—$SiO_2$ that is suitable for AlN and 2% Al powder plus a small amount of 3% CuCl. After drying at 80° C., a surface printing is performed on each side of the substrate using the same paste with the screen printing machine, except that it is diluted to 500 Pa·s. The substrate prepared in this way is run through a firing oven with $N_2$ at 900° C. in which the oxygen content is kept at a controlled 0-50 ppm $O_2$. The copper does not come in contact with the firing additive anywhere. Next, certain structures or the entire structure, already printed and fired, is reinforced on one or both sides with the aid of another copper paste with having low glass content. The structure is fired again under the same conditions. The thickness of the copper layer is now 70 μm. The copper layer is reinforced in a corrosion-proof and solderable manner with 4 μm nickel and 0.05 μm gold, both produced by currentless deposition. The metallization seals the ceramic, so tightly that the vias also do not have any leaks through which the low viscosity adhesive can penetrate to the top side of the LED.

Features of embodiments of the invention:

Ceramic circuit board of aluminum nitride with fired printed conductors and contact points made of copper or copper alloy where the thickness or height of the copper thickness of the printed conductors and contact points is between 20 and 500 μm, preferably 20 to 125 μm, especially preferably 60 to 90 μm.

Vias filled with copper, tungsten or molybdenum are arranged on the circuit board.

A ceramic substrate of aluminum nitride which has either been punched before sintering or has been laser drilled using a laser beam after sintering is used for this production.

The printed conductors and contact points are applied to a ceramic substrate with at least two screen printing processes and firing processes with copper or a copper alloy.

Two pastes are used and fired. The paste which is in direct contact and/or adjacent to the ceramic substrate is an adhesive paste with a glass content and the cover paste which is in contact with the former is designed with a low glass content because the printed conductors and contact points should be capable of being galvanized.

Exactly the same screen printing layout is used with both screen printing processes. However, if no thick printed conductor or thick contact point is needed in some locations, the second screen printing process can omit this location or these locations.

The second printing is preferably made approx. 0.01-0.05 mm smaller, so that the second paste does not run down the sloping sides of the first layer and cause widening of the structures in an uncontrolled manner.

In the first screen printing process a highly viscous copper paste is used as the adhesive paste, its viscosity being between 800 Pa·s and 1200 Pa·s. It is preferably between 900 Pa·s and 1100 Pa·s and especially preferably 1000 Pa·s.

The viscosity of the cover paste is lower than that of the adhesive paste to make the surface smoother and to minimize the screen cloth imprint. The cover paste preferably has a lower viscosity than the viscosity of the adhesive paste. The viscosity is preferably between ⅓ and ⅔ of the viscosity of the adhesive paste and is especially preferably 40% to 60% of the viscosity of the adhesive paste. However, the adhesive paste and the cover paste are chemically identical and differ only in their viscosity except for the glass content.

The copper paste preferably of the adhesive paste contains CuO and/or $Cu_2O$ and an adhesive glass of ZnO—$SiO_2$, which is suitable for AlN.

After the first screen printing operation the ceramic substrate is dried at suitable temperatures preferably 80° C.

The ceramic substrate of AlN is preferably 114×114×0.38 mm in size. The ceramic substrate is 0.38 mm thick.

The firing preferably takes place at 900° C. in a firing oven with $N_2$ (nitrogen) in which the oxygen content is kept at a controlled 6-10 ppm $O_2$.

In the firing oven the copper does not come in contact with the firing aid at any point.

It is claimed:

1. A method for producing a ceramic circuit board having electric printed conductors and contact points on at least one of two sides and having at least one via, comprising the sequential process steps of:

a) producing a ceramic substrate of aluminum nitride and creating a borehole at a location provided for the at least one via, b) filling the borehole with a first adhesive paste of copper, tungsten, molybdenum or their alloys or mixtures thereof, and c) one-pass overprinting using a first screen printing operation on at least one side of the ceramic substrate with a desired layout of the printed conductors and contact points using a second adhesive paste, d) firing the printed ceramic substrate in a firing oven with nitrogen, wherein an oxygen content is kept at a controlled level of 0-50 ppm $O_2$, e) printing using a cover paste with a low glass content on the second adhesive paste in a second screen printing operation until achieving a desired thickness of the printed conductors and contact points, f) firing the printed ceramic substrate in a firing oven with nitrogen, wherein the oxygen content is kept at 0-50 ppm $O_2$.

2. The method according to claim 1, wherein a downstream drying process or firing process of the ceramic substrate is performed after each screen printing process.

3. The method according to claim 1, wherein the printed conductors and contact points and/or the fired cover paste is/are reinforced with currentless deposition of nickel and gold.

4. The method according to claim 1, wherein the borehole is created at the location provided for the at least one via by punching before sintering or with a laser beam after sintering.

5. The method according to claim 1, wherein the first adhesive paste is a copper paste having a viscosity between 800 Pa·s and 1200 Pa·s.

6. The method according to claim 5, wherein the copper paste contains CuO or $Cu_2O$ and an adhesive glass, preferably of ZnO—$SiO_2$ suitable for AlN.

7. The method according to claim 5, wherein the copper paste contains components such as Al or Ti that cause a volume increase and substances that release copper in heat.

8. The method according to claim 1, wherein the second adhesive paste is identical to the first adhesive paste except for its viscosity, the viscosity of the second adhesive paste being half as great as that of the first adhesive paste.

9. The method according to claim 8, wherein the viscosity of the second adhesive paste is 500 Pa·s.

10. The method according to claim 1, wherein the cover paste is identical to the first adhesive paste except for an absence of adhesive glass, but it has a lower viscosity than the adhesive paste, wherein the viscosity of the cover paste is between ⅓ and ⅔ of the viscosity of the adhesive paste.

11. The method according to claim 1, wherein when repeating the overprinting of the printed conductors and contact points, the overprinting is 0.01-0.05 mm smaller.

12. The method according to claim 2, wherein the printed conductors and contact points and/or the fired cover paste is/are reinforced with currentless deposition of nickel and gold.

13. The method according to claim 2, wherein the borehole is created at the location provided for the at least one via by punching before sintering or with a laser beam after sintering.

14. The method according to claim 3, wherein the borehole is created at the location provided for the at least one via by punching before sintering or with a laser beam after sintering.

15. The method according to claim 1, wherein the first adhesive paste is a copper paste having a viscosity of between 900 Pa·s and 1100 Pa·s.

16. The method according to claim 5, wherein the copper paste contains an adhesive glass comprising ZnO—$SiO_2$ suitable for AlN.

17. The method according to claim 1, wherein the first adhesive paste is a copper paste having a viscosity of 1000 Pa·s.

18. The method according to claim 17, wherein the at least one via is filled with copper, tungsten or molybdenum or mixtures thereof.

* * * * *